United States Patent
Harned et al.

(10) Patent No.: US 7,405,802 B2
(45) Date of Patent: Jul. 29, 2008

(54) LARGE FIELD OF VIEW 2X MAGNIFICATION PROJECTION OPTICAL SYSTEM FOR FPD MANUFACTURE

(75) Inventors: Robert D. Harned, Redding, CT (US); Lev Sakin, Stamford, CT (US); Patrick de Jager, Veldhoven (NL); Cheng-Qun Gui, Best (NL); Irina Pozhinskaya, Stamford, CT (US); Noreen Harned, Redding, CT (US)

(73) Assignee: ASML Holding N.V., Veldhoven (NL)

( * ) Notice: Subject to any disclaimer, the term of this patent is extended or adjusted under 35 U.S.C. 154(b) by 73 days.

(21) Appl. No.: 10/921,097

(22) Filed: Aug. 19, 2004
(Under 37 CFR 1.47)

(65) Prior Publication Data

US 2005/0237505 A1 Oct. 27, 2005

Related U.S. Application Data

(63) Continuation-in-part of application No. 10/831,210, filed on Apr. 26, 2004, now Pat. No. 7,158,215.

(51) Int. Cl.
*G03B 27/42* (2006.01)
*G03B 27/52* (2006.01)
*G03B 27/68* (2006.01)

(52) U.S. Cl. .............................. 355/52; 355/53; 355/55

(58) Field of Classification Search ................... 355/46, 355/52, 53, 55, 60, 66, 67
See application file for complete search history.

(56) References Cited

U.S. PATENT DOCUMENTS 3,748,015 A 7/1973 Offner
3,821,763 A 6/1974 Scott
4,240,707 A 12/1980 Wetherell et al.

(Continued)

FOREIGN PATENT DOCUMENTS

EP 0 744 665 A1 11/1996

(Continued)

OTHER PUBLICATIONS

Search Report from Singapore Appl. No. 200403806-3, dated Nov. 29, 2004, 5 pages.

(Continued)

*Primary Examiner*—Rodney E Fuller
(74) *Attorney, Agent, or Firm*—Sterne, Kessler, Goldstein & Fox P.L.L.C.

(57) ABSTRACT

An exposure system for manufacturing flat panel displays (FPDs) includes a reticle stage and a substrate stage. A magnification reflective optical system images the reticle onto the substrate. The system may be a 2× magnification system, or another magnification that is compatible with currently available mask sizes. By writing reticles with circuit pattern dimensions that are one-half the desired size for an FPD, a 2× optical system can be used to expose FPDs. The designs for the 1.5× and larger magnification optical systems all typically have at least three powered mirrors. A corrector, positioned either near the reticle or near the substrate, can be added to the three mirror design to improve the systems optical performance. The corrector may be a reflective, or a refractive design. The corrector can have an aspheric surface, and optionally a powered surface.

51 Claims, 7 Drawing Sheets

U.S. PATENT DOCUMENTS

| | | | |
|---|---|---|---|
| 4,293,186 A | 10/1981 | Offner | |
| 4,650,315 A | 3/1987 | Markle | |
| 4,688,904 A | 8/1987 | Hirose et al. | |
| 4,693,569 A | 9/1987 | Offner | |
| 4,701,035 A | 10/1987 | Hirose | |
| 4,711,535 A | 12/1987 | Shafer | |
| 4,743,112 A | 5/1988 | Burke | |
| 4,747,678 A * | 5/1988 | Shafer et al. | 359/366 |
| 4,769,680 A | 9/1988 | Resor, III et al. | |
| 4,798,450 A | 1/1989 | Suzuki | |
| 4,834,517 A | 5/1989 | Cook | |
| 5,153,898 A | 10/1992 | Suzuki et al. | |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,530,516 A | 6/1996 | Sheets | |
| 5,579,147 A | 11/1996 | Mori et al. | |
| 5,625,436 A | 4/1997 | Yanagihara et al. | |
| 5,677,703 A | 10/1997 | Bhuva et al. | |
| 5,710,619 A | 1/1998 | Jain et al. | |
| 5,808,797 A | 9/1998 | Bloom et al. | |
| 5,880,834 A | 3/1999 | Chrisp | |
| 5,982,553 A | 11/1999 | Bloom et al. | |
| 6,033,079 A * | 3/2000 | Hudyma | 359/857 |
| 6,118,577 A * | 9/2000 | Sweatt et al. | 359/351 |
| 6,133,986 A | 10/2000 | Johnson | |
| 6,177,980 B1 | 1/2001 | Johnson | |
| 6,226,346 B1 * | 5/2001 | Hudyma | 378/34 |
| 6,229,595 B1 * | 5/2001 | McKinley et al. | 355/53 |
| 6,636,350 B2 | 10/2003 | Shafer et al. | 359/366 |
| 6,687,041 B1 | 2/2004 | Sandstrom | |
| 6,707,603 B2 * | 3/2004 | Ansley et al. | 359/366 |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,879,383 B2 | 4/2005 | Mercado | |
| 7,158,215 B2 | 1/2007 | Harned et al. | |
| 7,184,124 B2 | 2/2007 | Harned et al. | |
| 2003/0137644 A1 | 7/2003 | Tanaka et al. | |
| 2004/0041104 A1 | 3/2004 | Liebregts et al. | |
| 2004/0130561 A1 | 7/2004 | Jain | |
| 2004/0160666 A1 * | 8/2004 | Hudyma | 359/359 |
| 2004/0218162 A1 | 11/2004 | Whitney | |
| 2004/0263429 A1 | 12/2004 | Harned et al. | |
| 2005/0007572 A1 | 1/2005 | George et al. | |
| 2005/0128573 A1 | 6/2005 | Merz | |
| 2006/0139745 A1 | 6/2006 | Gui et al. | |
| 2007/0195304 A1 | 8/2007 | Harned et al. | |

FOREIGN PATENT DOCUMENTS

| | | |
|---|---|---|
| EP | 0947882 A2 | 10/1999 |
| JP | 48-012039 | 2/1973 |
| JP | 61-047917 | 3/1986 |
| JP | 9-146281 | 6/1997 |
| JP | 2001-290279 | 10/2001 |
| WO | WO98/33096 | 7/1998 |
| WO | WO98/38597 | 9/1998 |

OTHER PUBLICATIONS

U.S. Appl. No. 11/646,609, filed Dec. 28, 2006, Harned et al.
Hodge et al., "An 11.8-in Flat Panel Display Monitor", Hewlett-Packard Journal, vol. 46, No. 4, Article 8, pp. 51-60, Aug. 1995.
Search Report for European App. No. EP 04 01 4897, dated Feb. 2, 2007, 4 pages.
English Translation of *Notification of Reason(s) for Refusal*, from Japanese Patent Appl. No. 2004-19450, 3 pages, dispatched Jul. 17, 2007.
Written Opinion from Singapore Appl. No. 200403806-3, dated Jul. 31, 2007, 4 pages.
Translation of Office Action for Japanese Patent Application No. 2004-194590 mailed on Feb. 12, 2008, 2 pgs.

* cited by examiner

LARGE FIELD OF VIEW 2X MAGNIFICATION PROJECTION OPTICAL SYSTEM FOR FPD MANUFACTURE

CROSS-REFERENCE TO RELATED APPLICATIONS

This application is a continuation-in-part of U.S. patent application Ser. No. 10/831,210, filed Apr. 26, 2004, entitled LARGE FIELD OF VIEW PROJECTION OPTICAL SYSTEM WITH ABERRATION CORRECTABILITY FOR FLAT PANEL DISPLAYS, which is incorporated by reference herein.

BACKGROUND OF THE INVENTION

1. Field of the Invention

The present invention relates to projection optical systems used for flat panel display manufacture, and more particularly, to 2× and larger magnification compact projection optical systems for manufacturing of large flat panel displays (FPDs).

2. Related Art

The manufacture of a liquid crystal display, or a flat panel display (FPD) involves a manufacturing process that is similar to that used in semiconductor wafer manufacturing. A substrate is coated with a photo resist. An exposure system is used to project an image of a reticle onto the substrate, so as to expose the photo resist, and create a pattern of circuits on the substrate. When the exposure is finished, and the substrate is packaged, a flat panel display is formed.

Although FPDs have been in production since the late 1980s, the current size requirement are for FPDs of up to 42 inches diagonal, with 54 and 60 inches diagonal under development. (Note that screen size in the United States is usually specified in inches, while optical designs are normally done in millimeters.) This places severe requirements on the optics used in the projection optical system. Specifically, many existing optical designs, if scaled up to 42 inch FPD manufacturing size, become unreasonably large.

Optical designs, operating at 1× or at some other magnification, compatible with producing 42-inch full field scanners, require very large lenses and/or mirrors. To print 42-inch FPDs, the lithography tool must have a slit height of about 525 mm. The requirement that the optical design form be telecentric results in at least one element in the optical design being larger than 525 mm in diameter, with the exact diameter dependent on the optical systems numerical aperture and back working distance.

Reflective optical design forms operating at 1× magnification are successfully being used in the microlithography industry. FIG. 1 is an example of such a conventional system. While the design is capable of meeting the optical requirements for printing FPDs, this design form requires a concave mirror from about 1.2 m in diameter for the 42 inch display to a 1.7 m diameter for a 60 inch display. While fabricating mirrors of this size is possible, they may not be cost effective in a FPD lithography tool.

As shown in FIG. 1, a conventional design includes two spherical mirrors, a primary concave mirror 101, and a secondary convex mirror 102. Note that, as shown in FIG. 1, the primary mirror is used as a reflector twice. A reticle 103 is positioned off axis. The image of the reticle 103 is projected onto a substrate 104.

The mask making infrastructure to manufacture 1× reticles to work with the system in FIG. 1 for 42 to 60 inch FPDs is very limited. Adding the capacity to manufacture masks in the quantities needed will be very expensive and time consuming to develop. Adding the mask infrastructure development cost to the FPD may result in a FPD product cost that is unacceptably high.

Another method for manufacturing 42 inch and larger FPDs that gets around the need for the extremely large optics in FIG. 1 involves stitching together images of small sections of a 1× mask for creating the full FPD size required. A small, single optical system can be used to create the images of the mask sections one at a time. This is a very time consuming process to create the full FPD.

Another approach uses multiple small optical systems that simultaneously image the 1× masks onto the FPD substrate. A multiple channel system like this is described in published U.S. patent application No. 2003/0137644. This multiple column optical system has more error sources than a single optical system designed and sized to image the full reticle.

Printing FPDs using a stitching based imaging process results in low yields, and therefore high costs, during the manufacturing process. This is due to the fact that the type of imaging errors that occur during the stitching process are easily discernible when viewing large FPDs with a naked eye. To minimize stitching errors, sub-micron accuracy alignment of optical systems is required, which is not normally used in FPD manufacturing, due to cost considerations. As the FPD size increases the stitching related errors also increase resulting in ever more complicated FPD exposure tools.

It is generally thought that a cost effective stitching imaging technique for fabricating 42-inch FPDs will not work. FPD manufactures generally prefer full field scanning systems to any optical design configuration that employs stitching.

Other FPD lithography tools use a 1× magnification full field scan with a two mirror design first described in U.S. Pat. No. 3,748,015.

In the two-mirror approach of FIG. 1, a slot is imaged. This slot is the width of the 32 inch diagonal screen by a few millimeters. The slot is then scanned along the long side of the screen. For the 32-inch FPD a significant improvement in optical manufacturing capability and infrastructure was needed in order to be able to fabricate an approximately 800 mm diameter mirror required for the scanner optical system design.

A 42 inch screen is about 525 millimeters by 930 millimeters. This size reticle can only be produced in very limited volumes making it impractical to use where large quantities of 42 inch display need to be manufactured.

For FPDs with 54- and 60-inch diagonal dimensions the reticle sizes needed for a 1× lithography tool are about 1194× 574 mm and about 1328×747 mm. These sizes are beyond the current capability of reticle manufacturers. Significant research and development activities are required to develop mask writing tools in these sizes. Being able to use currently available reticle sizes to fabricate 54- and 60-inch FPDs offers many advantages.

Accordingly, it is desirable to have a projection optical system and an exposure system that can be used in the manufacture of large-scale FPDs, such as 42-inch, 54-inch, and 60-inch FPDs, currently contemplated by FPD manufacturers. It is also desirable to have a projection optical system that can use mask sizes compatible with the current masking manufacturing commercial infrastructure, which is capable of producing masks with diagonal dimensions of up to 32 inches.

SUMMARY OF THE INVENTION

The present invention is directed to a large field of view projection optical system with magnification and aberration correctability for flat panel display manufacturing that overcomes one or more of the problems and disadvantages of the related art.

Accordingly, there is provided an exposure system for manufacturing flat panel displays (FPDs) including a reticle stage adapted to hold a reticle. A substrate stage is adapted to hold a substrate. A magnification ringfield reflective optical system images the reticle onto the substrate. The system can be a 2× magnification system, or another magnification that is compatible with currently available mask sizes. By writing reticles with circuit pattern dimensions that are one-half the desired size for an FPD, a 2× optical system can be used to expose FPDs. To expose a 42 inch FPD, a half-scale image of the 42 inch circuit is written using the reticle writers designed to produce 32 inch reticles. The half scale image of the 42 inch display is 21 inches, so it easily fits on a 32 inch mask substrate. FPDs as large as 64 inches can be created by writing half scale circuit patterns with the 32 inch capacity reticle writer. Another example using mask writers design to produce 9 inch reticles for the computer processor and memory manufactures. It is possible to expose a 42 inch FPD using a 9 inch reticle with a 4.7× optical system, according to one embodiment of the invention.

The designs for the 1.5× and larger magnification optical systems all typically have at least three powered mirrors. A corrector, positioned either near the reticle or near the substrate, can be added to the three mirror design to improve the systems optical performance. The corrector can be a reflective, or a refractive design. The corrector can have an aspheric surface, and optionally a powered surface. The corrector can be a flat glass plate, or a lens having concave-convex, concave-concave or convex-convex surfaces.

Additional features and advantages of the invention will be set forth in the description that follows, and in part will be apparent from the description, or may be learned by practice of the invention. The advantages of the invention will be realized and attained by the structure particularly pointed out in the written description.

It is to be understood that both the foregoing general description and the following detailed description are exemplary and explanatory and are intended to provide further explanation of the invention.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the embodiments of the present invention, examples of which are illustrated in the accompanying drawings.

Optical exposure systems operating at magnifications of greater then 1.5× are proposed for exposing the circuit patterns for FPDs larger then 32 inches. These optical systems employ a minimum of three powered mirrors for imaging the circuit pattern. (Replacing one or more of the mirrors with lenses is possible, but not desirable, due to design residual aberrations when operating with other then a monochromatic light source.) There is an option of using either refractive or reflective corrector near the reticle and/or FPD substrate plane to improve image quality and reduce either or both distortion and telecentricity errors. By using optical systems with magnification to expose FPDs, reticles produced using the existing reticle manufacturing infrastructure can be used in printing FPDs larger then 32 inches.

Figure 2:
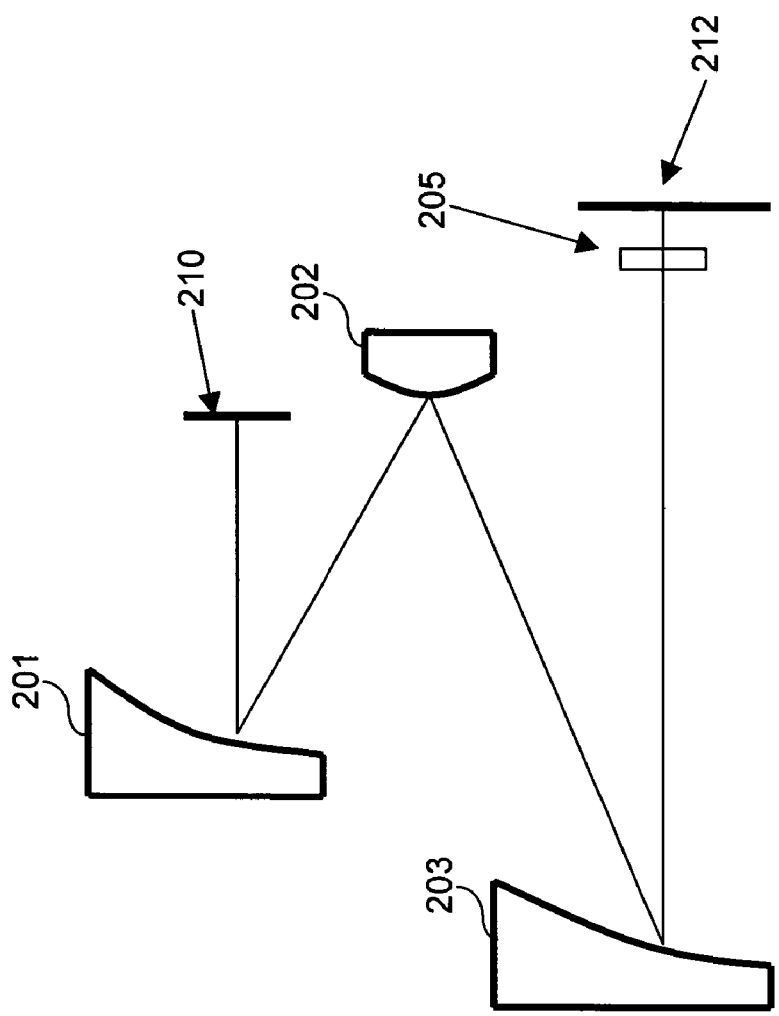
FIG. 2 is an example of a three powered mirror with a reflective corrector 2× ringfield optical design form for exposing FPD substrates larger than 32 inches diagonal, according to one embodiment of the invention.
Figure 3:
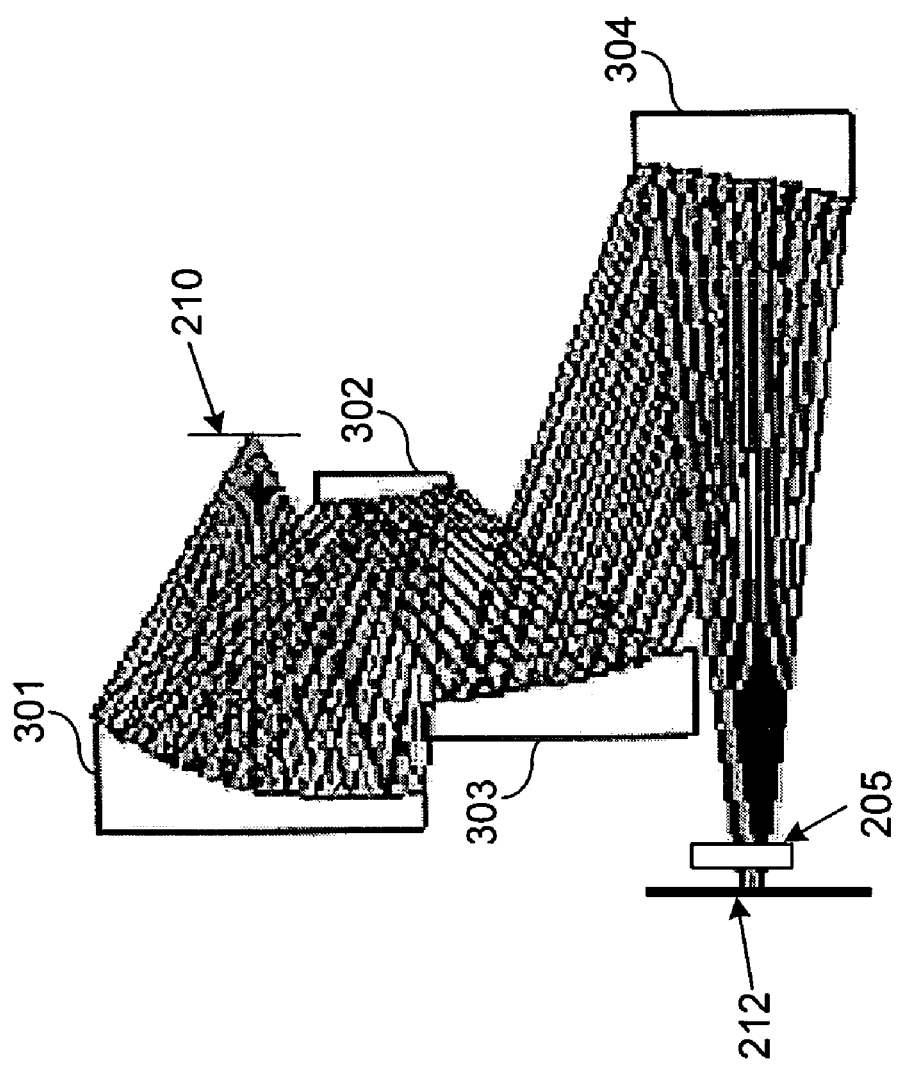
FIG. 3 is an example of a four powered mirror with a refractive corrector 2× ringfield optical design form, according to an alternative embodiment of the invention.

FIGS. 2 and 3 are examples of the design form for systems with 1.5× magnification and greater. The optical performance achievable depends on how well each of the aberration orders can be corrected. At the start of the optical design process the third order aberrations dominate the residual error with the higher order aberrations getting progressively smaller as the order number increases. In general, there is a point where the magnitude of the higher order aberrations becomes insignificant and can be ignored. This limits the number of aberrations that need to be corrected during the optical design process.

As previously noted, a degree of freedom in the optical design is required to correct each aberration term. Thus, a design form with a sufficient number of degrees of freedom is required for the optimized design to achieve the required optical performance. These are generally referred to as "third order aberrations." However, the more off-axis the system is required to operate, as is required for large FPDs, the more prominent third and higher order aberrations (e.g., coma, astigmatism, etc.) become.

Figure 1:
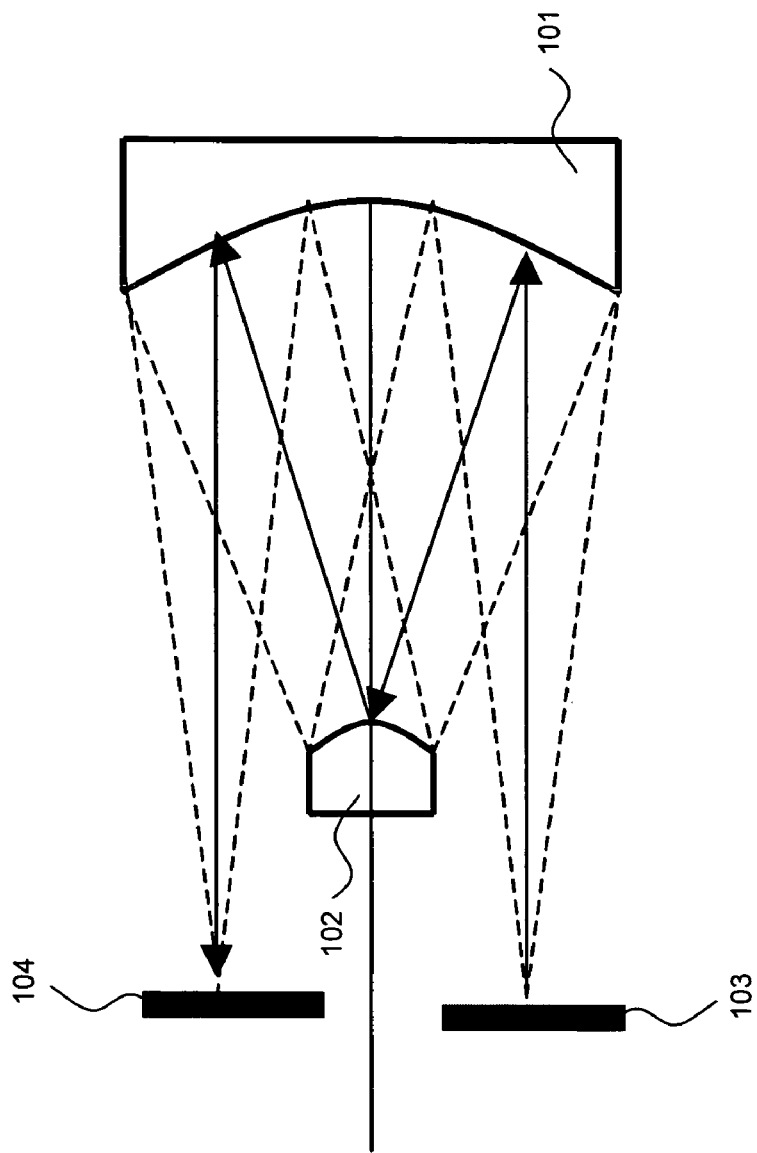
FIG. 1 shows an example of a conventional optical system used in manufacturing FPDs with diagonal dimensions of less than approximately 32 inches.

With larger FPDs, the conventional optical system shown in FIG. 1 needs to work further and further off-axis. The preferred optical design form is a "ringfield," sometimes referred to as an "annular field," or a "strip field," system. Therefore, it becomes increasingly difficult to correct for higher order aberrations. One way to correct for these aberrations is to change the mirror surfaces from being spherical to being aspherical. Essentially, this amounts to working with a wide angle system, causing additional difficulties in adjusting for off-axis-induced aberrations. From a practical perspective, in order to have a certain level of acceptable performance when going off-axis, the distance between the object and the axis has to be limited to keep the distortions due to the higher order aberrations to a minimum and still use spherical mirrors. Going even further off-axis, the mirrors need to aspherized.

Although an asphere can take the shape of any surface that can be mathematically described, an even or odd high order polynomial is typically used. The following equation is an example of a high order polynomial used to describe an asphere:

$$z = \frac{Cy^2}{1 + [1-(1+K)C^2y^2} + Ay^4 + By^6 + Cy^8 + Dy^{10}$$

where z is the departure of the aspheric surface from the base spherical surface sagittal; C is the reciprocal of the spherical surface radius of curvature; y is the location on the surface; K is an aspheric departure term, usually referred to as a conic constant; A, B, C, D are generally referred to as the coefficients of each high order term for the polynomial.

The equation above is an example of an "even" high order polynomial. In addition to the mirror surfaces radii of curvature being a design variable (degree of freedom) during the optical design process, each surface described by an even order polynomial can have the added degrees of freedom K, A, B, C, D . . . . As a result of having these extra degrees of freedom more aberrations can be corrected.

The number of aspheric terms used in the design is dependent on the acceptable optical design residual. The conic constant K, and the four higher order aspheric coefficients A, B, C and D result in acceptable performance for projection optics used to print 42-inch FPD circuits along with the desired object and image locations, magnification and arcuate slit width.

The challenge in designing ringfield optical systems for printing flat panel displays is achieving a "usable slit width" that is compatible with printing with the image quality and production rate requirements. All optical systems have aberrations that effectively limit the image quality achievable over the slit width.

"Usable slit width" is the maximum slit width over which the required feature size on the mask can be successfully printed at the desired location on the FPD. ("Feature size" and resolution are equivalent terms in this context. Distortion and overlay refer to "printed at the desired location".)

The usable slit width is impacted by the FPD size. The larger the FPD, the smaller the usable slit width if the overall length of the optical system is the same. An FPD projection optical system for printing 60 inch FPDs will only have the same usable slit width as a system to print 42 inch FPDs if the 60 inch system is allowed to have a longer overall length and larger optics.

The usable slit width is also dependent on the resolution and distortion requirements. An FPD with requirements for 2.5 μm resolution and 1 μm distortion will have a smaller usable slit width than if the requirements were for a resolution of 5 μm and distortion of 2 μm. As the resolution and distortion requirements decrease (i.e., become larger numerically), the usable slit width increases.

The resolution and distortion requirements for FPDs currently range from about 2.5 to about 10 μm and about 0.6 to about 2.0 μm respectively. The exact resolution and distortion requirements depend on how the FPD will be used.

The actual slit width needed to achieve the required FPD production rate strongly depends on the illumination system it will be used with. The same production rate can be achieved with a wide slit with a low power light source system and a narrow wide slit with a high power light source system. However, as wide a slit as possible is preferred because of a desire for high throughput. Whether a particular design form achieves the requirements depends on the magnification, resolution, distortion, size and production requirements.

The magnification requirement for the projection optics depends on the size of the circuit pattern on a reticle. A reticle can be designed to be exactly 50 percent of the size of the FPD. A 42 inch FPD for this scenario would have a mask with a 21 inch diagonal.

The circuit pattern on the 21 inch reticle would actually be about 22 inches. A region around what will be the viewing area on the FPD is needed for circuitry to transfer the electrical information to the area on the screen design for viewing. However, the circuit pattern that the FPD viewer will see is 21 inches.

A 21 inch reticle would need projection optics with a 2× magnification to print the 42 inch FPD. The magnification at which the projection optics operate can be adjusted by changing the distances between the reticle and the first mirror in the system, and between the FPD substrate and the last mirror (or a corrector). While the 2× design may provide adequate imagery for a reticle designed to operate at 2.1×, a design optimized for 2.1× will always have better optical performance.

In the optical designs discussed herein, the mirrors' radii of curvatures, aspheric profiles and spacings are optimized so the residual aberrations are sufficiently low enough, so that the image quality required for printing FPDs of acceptable quality. A "corrector" element that is located close to either or both the reticle and FPD substrate can be added.

The optical designs are usually derived through an iterative process where the curvatures, asphericity and spacings are adjusted until the desired optical performance is obtained. The optical design process is non-linear. For high quality optical systems, designs cannot be developed based on intuition or equations where a unique design can be derived. Because of this, commercially available optical design programs are used to develop optical designs. Generally, there are many designs that will work, often an infinite number of designs.

Zemax™ and Code V™ are examples of optical design programs that can be employed to develop an acceptable optical design. The values calculated by the programs for the curvatures, asphericities and spacings of the optical elements that result in acceptable optical performance depend on the starting values for these parameters, optics size limits and the specific metrics selected to evaluate the design during the optimization process.

All the numeric calculations necessary to trace the rays through an optical system during the design process are performed using such optical design programs. An optical design program on a desktop computer can perform hundreds of optical designs per minute. However, the optical designs optimized by the computer are only as good as the optical performance and manufacturing information it is given to evaluate the designs it calculates. While the design programs have some artificial intelligence, on their own they will rarely arrive at the optimum solutions when operated by an inexperienced person. The best solutions can only be obtained when the programs are given the correct parameters for the design to meet. This set of parameters or requirements is called a "merit function." Nowadays, optical designers often design merit functions, not optical designs themselves. The optical design programs evaluate thousands, and sometimes millions, of different optical designs to find the design whose performance closest meets the performance defined by the merit function.

Different optical design solutions are found by the design program for each different merit function. Slight changes in the merit function may result in very different solutions. There is no "best" optical design for printing the 42, 54 and 60 inch flat panel display circuit patterns—a very large number of designs are possible.

Magnifications of about 1.5× to >6× (e.g., 9×) are possible with a 4 mirror design form by changing the optical design parameters (radius of curvature, aspheric profile and spacings between mirrors). These designs can be developed using the same optical design process as for a 2× system, as would be understood by one of ordinary skill in the art.

The corrector element performs a specific function. Where the selection of the mirror curvatures, asphericities and spacings effect the system magnification, size of optics and image quality, the corrector element is intentionally preferably located near the reticle and/or FPD substrate so it will only affect image quality. The corrector's only purpose is to increase the usable slit width when an optical design with a wide slit width is required.

A FPD projection optics system to print 42 inch displays that uses just four mirrors will have a usable slit width of about 2 mm. Adding the corrector element to the optical design can increase the usable slit width to 10 mm or more.

The corrector can be a mirror (reflective) or a lens (refractive). The mirror would be tilted at about 45 degrees. The exact tilt angle is not critical. Having reflective optics (mirror) instead of refractive optics (lens) has the advantage that there will not be any chromatic aberration (wavelength dependent aberration). This is especially important because it is desirable to use a broadband source system to maximize the product throughput.

The broadband spectrum results in more power (watts/cm$^2$) being available to expose the photoresist coated FPD substrate. The greater the power, the shorter the exposure time needed. Thus, more FPD can be exposed per hour.

Because of the ringfield design form, the reflective corrector will introduce more unwanted optical design residual aberrations than the refractive corrector. In some circumstances the higher aberrations will result in a smaller usable slit width. There is a trade-off that needs to be made between the refractive corrector's chromatic aberration and the residual aberrations due to the reflective corrector needing to operate at about 45 degrees to the incident beam. The result of the trade-off depends on the spectral bandwidth, how close the reflective corrector can be to the reticle and/or the FPD substrate, and on the FPD diagonal size. In some cases the refractive corrector will be preferred, and, in others, the reflective corrector.

Resolution, overlay and telecentricity are usually used to specify the quality of an optical system for printing FPDs. The residual aberrations in the optical design determine the resolution, overlay and telecentricity achievable. The aberrations vary across the slit width. Generally the residual aberrations increase on either side of the center of the slit. Depending on the particular optical design and FPD size, the magnitude of the important aberrations can increase at rates up to at least the fifth power of the slit width.

Residual aberrations are those aberrations that cannot be perfectly corrected during the optical design process.

While it is desirable to optimize the optical design so all the aberrations are as close to zero as possible, acceptable optical performance can be achieved as long as the aberrations of concern are smaller then a certain level. The exact amount of aberrations depends on a mix of residual aberrations and the magnitude of other aberrations in the system.

In sum, there are effectively an infinite number of four mirror optical designs that will achieve the desired optical performance over the required slit width, which is determined by production rate requirements.

The proposed 2× system magnifies the circuit pattern on the reticle, and can operate in the visible and ultraviolet wavelength range.

Note that scaling an optical design from a certain slit height is not just a matter of multiplying all the system dimensions by that factor. Aberrations in the system also increase by the same factor, which can result in unacceptable optical performance.

While low aspheric departure and angle of incidence range have some advantages from an optical manufacturing perspective, for FPD manufacturing systems, they are not an important consideration when developing the optical design.

The quality level of the optics required, for example, for an EUV projection optics system must be at least about 30 times better than for an FPD optical system.

The present invention describes a four mirror optical system magnifies a reticle by nominally 2× for exposing photoresist coated substrates. The design form does not have an obscuration.

The refractive corrector can either be located in front of the reticle or close to FPD substrate. This design form also does not have an obscuration. The corrector element enables the minimum feature size to be obtained over a wider slit width, which in turn enables more FPDs to be produced per hour.

Refractive correctors also can be located in front of both the reticle and FPD substrate. The corrector elements enable the minimum feature size to be obtained over a wider slit width, which in turn enables more FPDs to be produced per hour.

The reflective corrector, if used, has no chromatic aberration, so it has better optical performance in terms of minimum feature size and depth of focus then a system employing refractive correctors. Reflective correctors can be located in front of both the reticle and FPD substrate.

The mirrors and lens surfaces in the optical system can be convex, concave, flat and/or aspheric. The preferred optical design uses both concave and convex surfaces to correct an aberration referred to as field curvature. This aberration is corrected by choosing the radius of curvatures of the mirrors so their reciprocals (1/Rc, where Rc is radius of curvature) sum to zero. In the summing process the concave surfaces have "+" values while the convex surfaces have "−" values. For example, three concave and one convex mirrors can be used, or two concave and two convex mirrors can be used.

If a design has corrector elements, it is not necessary for the mirror curvatures to exactly sum to zero. The curvatures of the corrector lens surfaces can be selected to correct field curvatures.

Employing aspheric surfaces in the design enables a smaller package size and superior optical performance as compared to designs with just spherical mirrors.

Furthermore, it is possible that the aspheric surfaces cannot be described using the standard asphere equations in optical design programs. It can be defined by a 1,000×1,000 array of data points. The data array size can vary. A 500×500 array might be acceptable or a 10,000×10,000 array might be required. The greater the number of points in the array, the more accurate the surface and therefore the better the optical performance of the system. Such a surface may, however, be approximated by an equation.

Obscurations usually occur in optical systems using mirrors if they are designs that operate "on-axis." On-axis refers to an optical design form where the optical elements and the optical performance are symmetric about the centerline of the system. Also, an optical system incorporating both refractive and reflective elements is often referred to as a "catadioptric" design. All-reflective designs are "catoptric," while all-refractive designs are called "dioptric."

The non-obscured optical design form is referred to as a "ringfield" or "off-axis" design. The optical elements in this system are not symmetric about their centerline or optical axis. The mirrors are usually called "off-axis aspheres". They are actually more difficult and costly to manufacture and align in a system than the on-axis and spherical surface elements used in on-axis designs, unless computer controlled generating, grinding and polishing equipment is available.

The FPD sizes 42, 54 and 60 inches are somewhat arbitrary. There is no reason why a 48 inch or even a 24 inch FPD (or any other size) cannot be printed using the designs described herein.

Optical systems can be designed for each different size FPD. This option has the advantage that the optics in the 42 inch system will be smaller then for the 60 inch system. Smaller optics cost less to manufacture so the lithography machine can be sold for less.

It is also possible to use a 60 inch optical system to print smaller size FPDs, including the 42 and 54 inch FPD sizes. This is accomplished by using different size reticles for each FPD size to be printed. For a 2× optical system reticle sizes 21, 27 and 30 inches would produce FPD sizes of 42, 54 and 60 inches, respectively.

The advantage of developing only a 60 inch system is that only one lithography tool needs to be designed and manufactured for three generations of FPDs.

Each generation corresponds to an FPD size. The 42 inch panel is considered a Generation 6 product, while 60 inches refers to a Generation 8 FPD.

Note that although the present invention is applicable to 2× magnification systems, it is also applicable to other magnifications, and can be used to allow a mask is designed for a particular generation, to be used for a subsequent generation. By introducing an appropriate magnification into the projection system, a Generation 5 mask (used for manufacturing 32 inch panels in a 1× magnification system) can be used to make, for example, Generation 6 flat panel displays, which are 42 inches. Similarly, with approximately 2× magnification, Generation 5 masks previously used in a 1× magnification system can be used to manufacture Generation 8 (60 inches). Also, IC-sized masks can be used for imaging FPD substrates.

Minimum feature size refers to the smallest image that can be printed by the optical system. It is also sometimes referred to as resolution and CD (critical dimension). The four mirror design form can be used to print essentially any size feature. However, as the feature size requirements get smaller, the size of the optics in the FPD optical system gets larger, the surface shape of the optics becomes more complicated and the quality level of the optics must get better. The change in optics size is not insignificant. Basically, if the feature size requirement decreases by 50 percent (from 5 µm to 2.5 µm, for example), then the optical elements will become twice as larger (from 500 mm to 1,000 mm, for example).

The minimum feature size needed depends to a large extent on how "sharp" an image is needed on the PFD screen. It also depends on how close the viewer sits to the screen. An FPD used as a computer screen, where the viewer is only 15 inches from the screen, needs to have a smaller feature size than an FPD used as part of a home theatre system, where the screen can be 10 feet away from the viewer. Sharpness is related to the resolution of the eye and peoples personal viewing experiences. Everyone has about the same limit on what the eye can resolve (i.e., everyone with 20:20 vision can resolve the same type size).

There are also cost considerations when considering the minimum feature size requirement. A consumer may be willing to accept a less visually pleasing image on the FPD screen if the FPD can be purchased for ⅓ the price of the best FPD.

Depending on the FPD, circuit design feature size requirements may also be related to the minimum size line in the circuit pattern necessary to perform certain functions.

The minimum feature size is a somewhat subjective determination. While one manufacturer considers 2.5 µm to be the desired resolution for the optical system, competitors might say 1.5 µm is necessary or that 3.5 µm is adequate.

Best optical performance is achieved by locating the corrector element as close as possible to the reticle and FPD substrates. The further the corrector is located from the reticle and the FPD substrate, the less the benefit to the systems optical performance.

The substrate for the 42 inch FPD is typically about 1,500× 1,800×1 mm thick. Six 42 inch screens are printed on a single substrate. The substrate is coated with photoresist.

An illumination system includes a light source (usually a mercury lamp) and optics to shape and direct the "light" to the reticle. The reticle is an approximately 0.2 inch special glass window that has the desired circuit pattern on it. Light from the source system goes through the reticle and then into the projection optics (PO). The PO images the reticle on the photoresist coated FPD substrate. One 42 inch circuit pattern at a time is imaged on the FPD substrate. After each 42 inch circuit pattern is imaged. the stage the FPD substrate is mounted on steps over so another FPD can be exposed. (In an alternative embodiment, the reticle may be a spatial light modulator array.)

Table 1 below shows exemplary top-level requirements for an optical system for printing 42 inch flat panel displays, though it will be understood that the data is provided as an example only, and the invention is not limited to these numbers.

TABLE 1

| | Optical System Requirements | |
|---|---|---|
| | Requirement | Comments |
| Screen size | 42-inch (Generation 6) | Slit height: 550 mm |
| Resolution | 2.5 µm (Minimum) | Requires NA = 0.11 |
| Depth of Focus | >±20 µm | Up to ± µm with 10 µm resolution |
| Overlay | 0.6 µm | 3-sigma |
| Telecentricity | Both reticle and "wafer" | Optics size implications |
| Wavelength | G, H or I-line | G-line usually preferred |
| Wavelength Bandwidth | Broadband (G, H and I) | |
| Reticle Size | 725 × 325 mm (now used for 32-in screen with 1X litho tool) | |
| Volume | 1.5 × 1.5 × 2.0 m | Estimate |
| Throughput (exposure time in seconds) | 70 sec | Requires >9 mm slit width with 10 KW lamp |

It will be appreciated that a change to any of these requirements will result in a different prescription for the four mirror optical design form.

EXAMPLE 1

A four mirror ringfield optical design form with a refractive corrector plate is proposed, shown in FIG. 3, for printing Generation 6 FPDs and beyond that operates at magnifications consistent with mask substrate sizes from Generation 5 (32 inches) and Generation 4 (about 22 inches). In particular, a nominally 2× optical design would enable FPD manufacture up to about 60 inches in size to be produced using a 32-inch Generation 5 mask substrate. An example of the 2× optical system is a 42-inch Generation 6 FPD being printed using a 21-inch diagonal mask pattern that is written on a 32-inch diagonal mask substrate. Table 1 shows the sizes of the Generation 6, 7 and 8 mask patterns with a 2× system relative to the size of a Generation 5 substrate.

TABLE 1

Mask Pattern Sizes For Generation 6, 7 and 8 FPDs With 2X Projection Optics

| FPD Generation | | Actual Screen Size | | Mask Size For 2X Projection Optics | | |
|---|---|---|---|---|---|---|
| Number | Diagonal (in) | Horizontal (in) | Vertical (in) | Horizontal (in) | Vertical (in) | Comments |
| 5 | 32 | 27.8 | 15.7 | NA | NA | Mask substrate size for 1X Projection Optics |
| 6 | 42 | 36.5 | 20.5 | 18.5 | 10.25 | Fits on 32-inch mask substrate |
| 7 | 54 | 47.0 | 26.4 | 23.5 | 13.2 | Fits on 32-inch mask substrate |
| 8 | 60 | 52.5 | 29.4 | 26.1 | 14.7 | Fits on 32-inch mask substrate | third order aberrations with higher order aberrations at a particular radius from the optical axis, in this optical design radii of curvatures, spacings, aspheric coefficients, etc., cannot be obtained by scaling from a conventional four mirror optical design. Instead, the refractive corrector plate 205 is employed.

The refractive corrector plate 205 does introduce chromatic aberration. However, because of a combination of the thinness of the corrector plate 205, the zero power design, location of the substrate relative to the image plane, and the numeric aperture (NA) of the imaging beam, the corrector plate 205 does not introduce a level of chromatic aberration that compromises the image size or distortion.

Table 2 compares the baseline performance of the design of FIG. 3 to nominal optical specifications required to produce FPDs of acceptable quality and at an acceptable production rate for Generation 6 FPDs.

TABLE 2

Optical Performance Of Baseline Flat Panel Display 2X Design With Refractive Corrector FPD Full-Field Scanner Optical System Nominal Requirements

| | Wavelength Bandwidth | Slit Width | Back Working Distance | Resolution | Depth Of Focus | Overlay (Distortion) | Magnification Control |
|---|---|---|---|---|---|---|---|
| Requirement | G, H and I-Line | >8.0 mm | >20.0 mm | <4.0 μm | >±20 μm | <0.1 μm | <15 PPM |
| Baseline Design | Yes | Yes | Yes | Yes | Yes | Yes | Yes |

As compared to a conventional four-mirror projection optics system, incorporating a refractive corrector plate in the design provides additional optical performance benefits.

For example, usable slit width is increased because the corrector plate improves image quality by reducing the residual astigmatism that occurs away from the center ringfield radius in the four-mirror design. Also, distortion (and thus overlay performance) is reduced, which increases the usable slit width. An increase in usable slit width is very important because it is directly related to the throughput achievable by the tool.

The 2x optical design form of FIG. 3 utilizes four powered mirrors 301-304, three of which are off-axis aspheres in the baseline design. The corrector plate 205, which is located near the image plane, has two flat surfaces (radii of curvature equal to infinity), but one surface has an aspheric curve corrects for distortion. The thickness of the corrector plate 205 is chosen based upon the amount of astigmatism to be corrected. The exact radii of curvatures, aspheric coefficients and spacings for the mirrors 301-304 depend on the slit width operation requirements.

Figure 6:
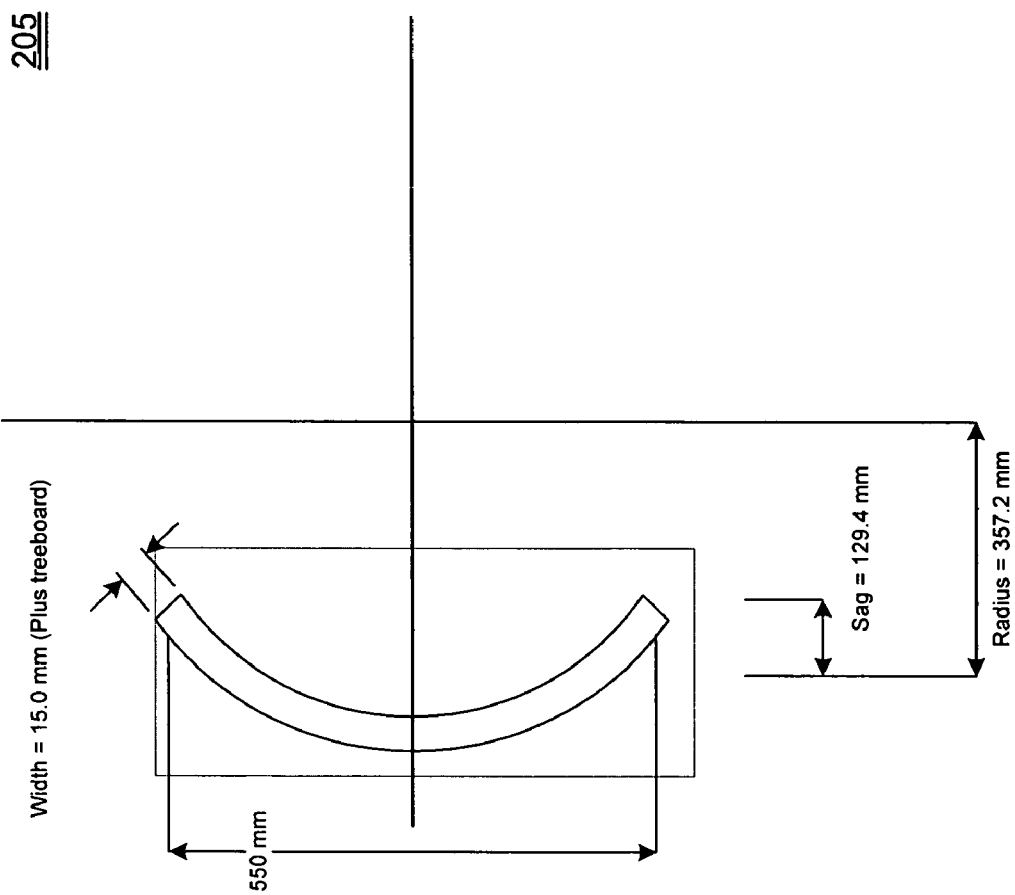
FIG. 6 shows the arcuate shape of a refractive corrector plate as used in, e.g., the embodiment of FIG. 3.

Reflective 4x ringfield optical designs have been developed for reduction based lithography tools, primarily for EUV. While all ringfield design forms are based on balancing The corrector plate 205 is used to correct the aberrations that usually limit the usable slit width. FIG. 6 shows the arcuate shape of the corrector plate 205 (not shown to scale).

EXAMPLE 2

A three-mirror exemplary ringfield optical design form with a refractive corrector plate, shown in FIG. 2, can be used for printing Generation 6 FPDs and beyond, that operates at magnifications consistent with mask substrate sizes for Generation 5 and 4. In particular, a nominally 2x optical design with mirrors 201-203 enables FPDs up to about 60-inches in size to be produced using a 32-inch Generation 5 mask substrate.

The 2x optical design form of FIG. 2 utilizes three powered mirrors 201, 202, 203, which are all off-axis aspheres in the baseline design. A corrector plate 204, which is located near the image plane, has two flat surfaces (radii of curvature equal to infinity), but one surface has an aspheric curve that is designed to correct distortion. Corrector plate 204 may be located near a reticle 210 or near a substrate 212. The thickness of the corrector plate 204 is chosen based upon the amount of astigmatism to be corrected. The exact radii of curvatures, aspheric coefficients and spacings for the mirrors 201, 202, 203 depend on the slit width operation requirements.

As compared to a conventional three-mirror projection optics system, incorporating the refractive corrector plate 205 in this design provides additional optical performance benefits.

For example, usable slit width is increased because the corrector plate improves image quality by reducing the residual astigmatism that occurs away from the center ringfield radius in the four-mirror design. The lens is more efficient at correcting astigmatism and distortion then adding an additional powered mirror to a three mirror design to create a four-mirror projection optics. Also, distortion (and thus overlay performance), is reduced which increases the usable slit width. An increase in usable slit width is important because it is directly related to the throughput achievable by the tool.

The corrector plate 205 corrects the aberrations that usually limit the usable slit width.

Table 3 compares the baseline performance of the design of FIG. 2 to the nominal optical specifications required to produce FPDs of acceptable quality and at an acceptable production rate for Generation 6 FPDs.

TABLE 3

Optical Performance Three Mirror 2X Design With Refractive Corrector

| Wavelength Bandwidth | Slit Width | Back Working Distance | Resolution | Depth Of Focus | Overlay (Distortion) | Magnification Control |
|---|---|---|---|---|---|---|
| G, H and I-Line | >4.0 mm | >20.0 mm | <4.0 μm | >±20 μm | <0.6 μm | <15 PPM |

EXAMPLE 3

Figure 7:
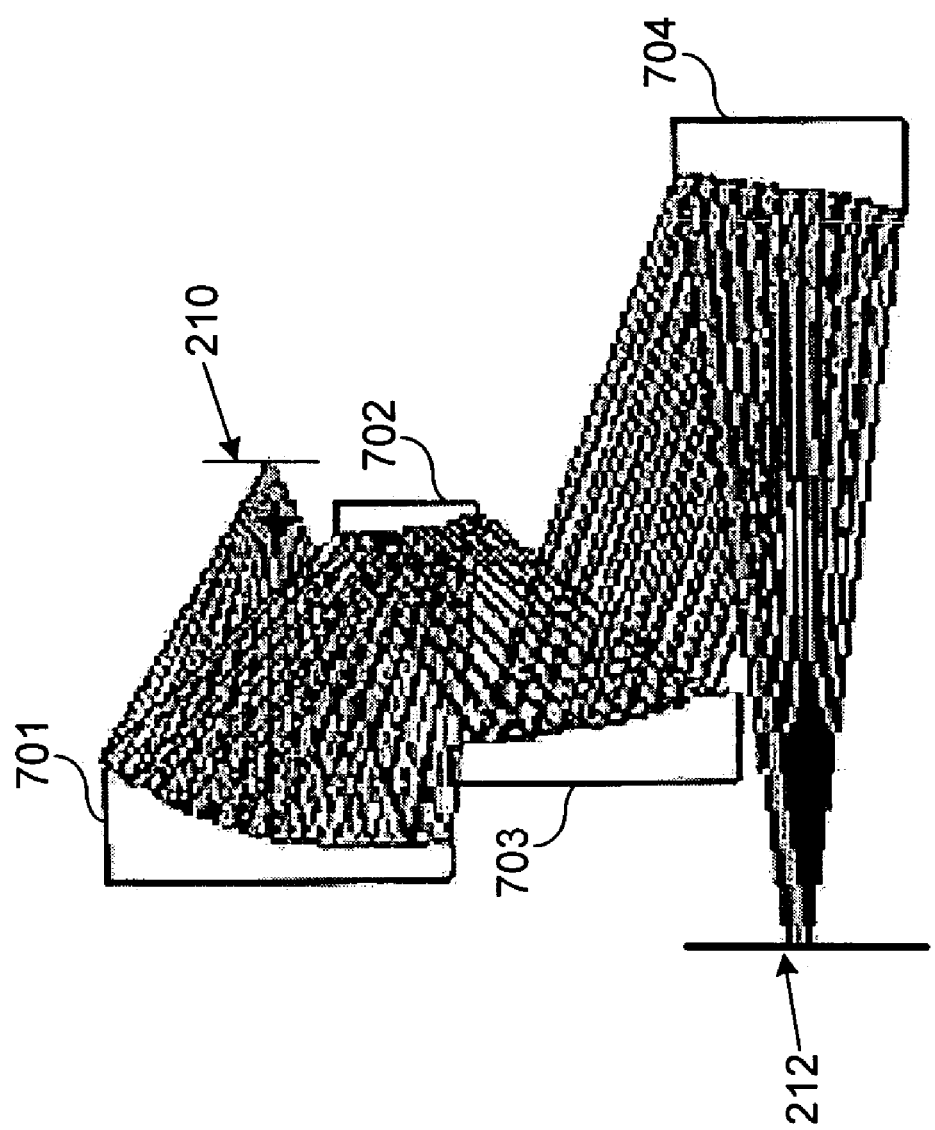
FIG. 7 shows another exemplary four-mirror ringfield optical design form.

An exemplary four-mirror ringfield optical design form, shown in FIG. 7, is proposed for Generation 6 and beyond that operates at magnifications consistent with mask substrate sizes from Generation 5 and 4. In particular, a nominally 2× optical design would enable FPDs up to about 60-inches in size to be produced using a 32-inch Generation 5 mask substrate.

The 2× optical design form of FIG. 7 utilizes four powered mirrors 701-704, three of which are off-axis aspheres in the baseline design. The exact radii of curvatures, aspheric coefficients and spacings for the mirror depend on the slit width operation requirements.

Table 4 compares the baseline performance to the nominal optical specifications required to produce FPDs of acceptable quality and at an acceptable production rate for Generation 6.

In particular, a nominally 2× optical design would enable FPDs up to about 60 inches in size to be produced using a 32-inch Generation 5 mask substrate.

Figure 5:
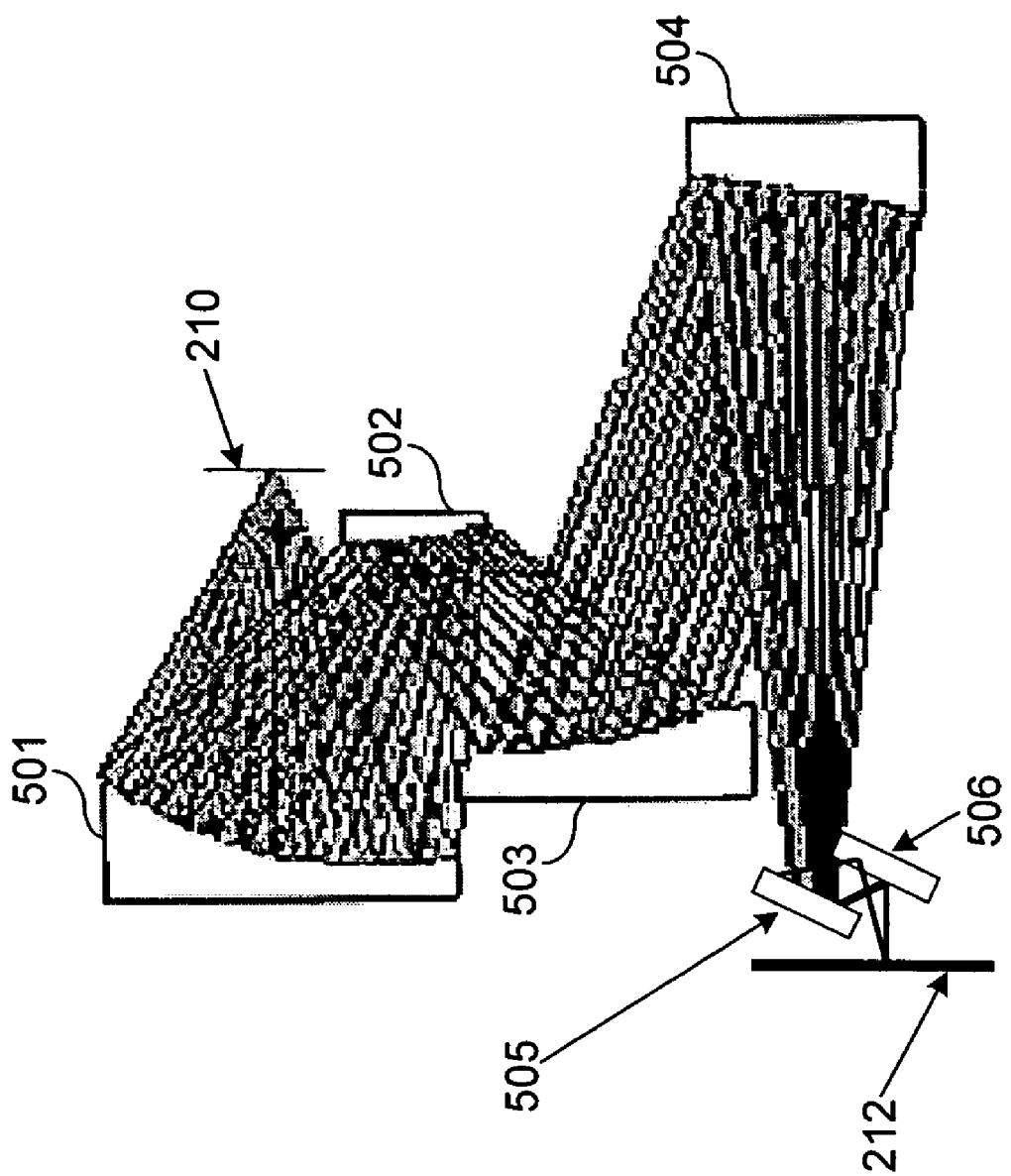
FIG. 5 is an example of a four powered mirror with two reflective correctors 2× ringfield optical design form, according to another alternative embodiment of the invention.

The 2× optical design form of FIG. 5 utilizes four powered mirrors 501-504, three of which are off-axis aspheres in the baseline design. The powered corrector plates 505-506 are mirrors located near the image (or near the mask) plane and at a (nominally) 45-degree tilt. The exact radii of curvatures, aspheric coefficients and spacings for the mirrors 505-506 depend on the slit width operation requirements. The aspheric departure and powers along both axes on the corrector plates 505, 506 depends on the magnitude and order of the distortion and astigmatism to be corrected. Reflective aspheric corrector plates have not been used before in lithography tools.

Adding power to the corrector plate 505-506 surfaces enables further image quality improvement. The dominant aberration affecting image quality is astigmatism, which is essentially different curvatures of the projection optics wavefront in the X and Y axes. Adding different amounts of power along both axes (or one axis depending on the residual astigmatism) compensates for the curvature variation in the projection optics wavefront. This improves image quality across the field, which increases the usable slit width and depth of focus projection optics. An increase in usable slit width is very important because it is directly related to the throughput achievable by the tool.

As compared to a four-mirror projection optics system and a four-mirror system with a refractive corrector plate, incorporating a double reflective corrector plate in the design provides additional optical performance benefits.

TABLE 4

Optical Performance Of Four Mirror 2X Design

| Wavelength Bandwidth | Slit Width (mm) | Back Working Distance (mm) | Resolution (μm) | Depth Of Focus (μm) | Overlay Distortion (μm) | Magnification Control (PPM) |
|---|---|---|---|---|---|---|
| G, H and I-Line | >5.0 | >20.0 | <4.0 | >±20 | <0.6 | <15 |

EXAMPLE 4

An exemplary four-mirror ringfield optical design form with a double reflective powered corrector plate, shown in FIG. 5, is proposed for printing Generation 6 FPDs and beyond, that operates at magnifications consistent with mask substrate sizes from Generation 5 and 4. The reflective corrector plates have aspheric surfaces to correct residual distortion and telecentricity errors. The surfaces also have bimorphic power to correct the residual astigmatism in the optical design. The combination of the aberration correction possible using the aspheric and bimorphic surfaces enables the usable slit width and depth of focus to be significantly increased.

For example, distortion (and thus overlay performance) is significantly reduced or eliminated as compared to the four-mirror system resulting in a wider usable slit width and increased usable depth of focus. Distortion is usually the limiting aberration in determining the usable slit width. Also, the usable depth of focus and slit width is increased for the reflective corrector because it does not have the chromatic aberration present with a refractive corrector. To obtain the same level of distortion correction, the refractive corrector requires more aspheric departure as compared to the reflective corrector making the reflective corrector easier to fabricate. The double reflective corrector not only perfectly corrects distortion errors, but also enables residual telecentricity errors from mirror mid-frequency surface figure errors to be corrected. This increases the usable slit width and depth of focus.

The corrector plates 505-506 are important in correcting the aberrations that usually limit the usable slit width.

Table 5 compares the baseline performance to the nominal optical specifications required to produce FPDs of acceptable quality and at an acceptable production rate for Generation 6.

TABLE 5

Optical Performance Of Four Mirror Design With Reflective Corrector

| Wavelength Bandwidth | Slit Width | Back Working Distance | Resolution | Depth Of Focus | Overlay (Distortion) | Magnification Control |
|---|---|---|---|---|---|---|
| G, H and I-Line | >4.0 mm | >20.0 mm | <4.0 μm | >±20 μm | <0.6 μm | <15 PPM |

EXAMPLE 5

Figure 4:
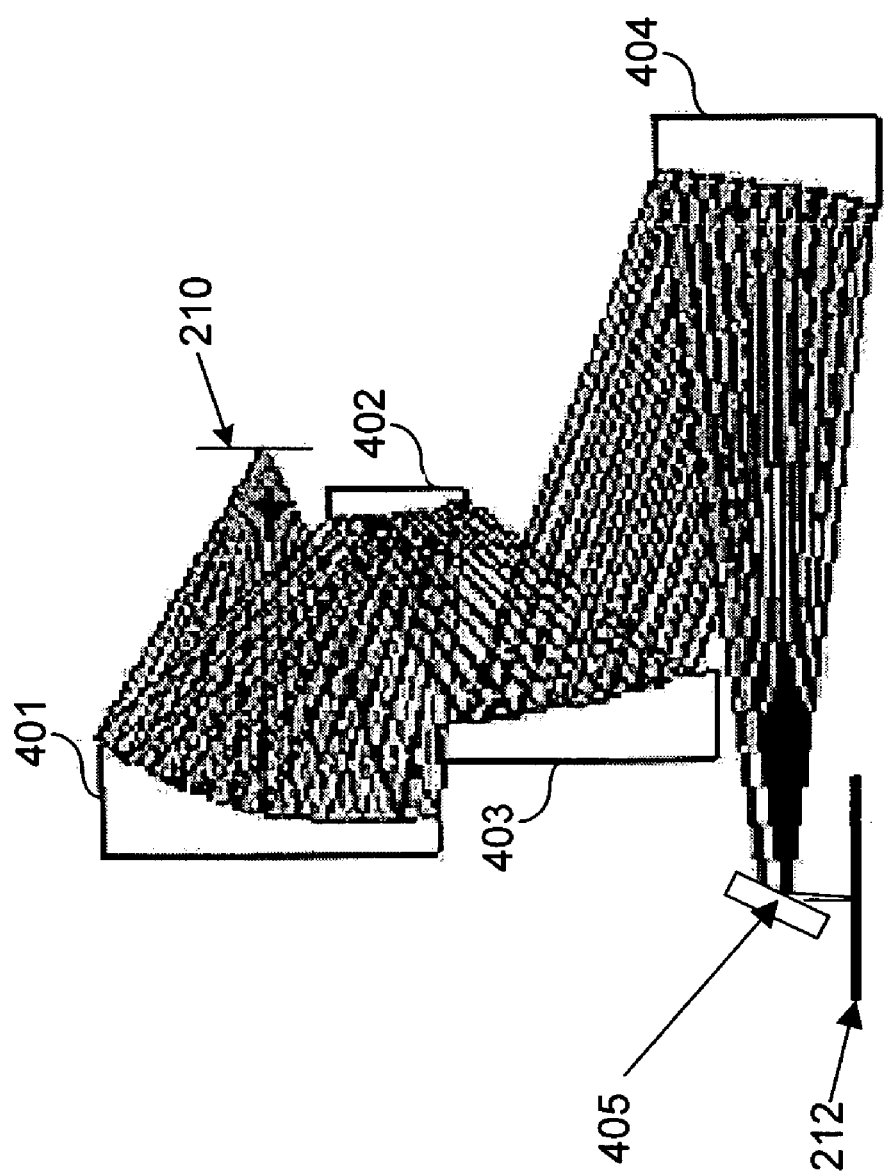
FIG. 4 is an example of a four powered mirror with a reflective corrector 2× ringfield optical design form, according to another alternative embodiment of the invention.

An exemplary four-mirror ringfield optical design form with a simple reflective distortion corrector plate, shown in FIG. 4, is proposed for printing Generation 6 FPDs and beyond that operates at magnifications consistent with mask substrate sizes from Generation 5 and 4. In particular, a nominally 2× optical design would enable FPDs up to about 60-inches in size to be produced using a 32-inch Generation 5 mask substrate.

The 2× optical design form of FIG. 4 utilizes four powered mirrors 401-404, three of which are off-axis aspheres in the baseline design. A corrector plate 405 is a mirror located at near the image plane and at a 45-degree tilt. The exact radii of curvatures, aspheric coefficients and spacings for the mirrors 401-404 depend on the slit width operation requirements. The aspheric departure on the corrector plate 405 depends on the magnitude and order of the distortion to be corrected.

Table 7 compares the baseline performance to the nominal optical specifications required to produce FPDs of acceptable quality and at an acceptable production rate for Generation 6.

TABLE 7

Optical Performance Of Four Mirror 2X Design With Reflective Corrector

| Wavelength Bandwidth | Slit Width | Back Working Distance | Resolution | Depth Of Focus | Overlay (Distortion) | Magnification Control |
|---|---|---|---|---|---|---|
| G, H and I-Line | >8.0 mm | >20.0 mm | <4.0 μm | >±20 μm | <0.1 μm | <15 PPM |

In no area would the proposed tools and optical design forms described in these examples have less optical performance then optical design forms currently in use. For optical systems with non-unit magnification, the optical performance obtainable depends completely on the number of parameters that can be varied during the optimization process. Because symmetry design principles are not available in a 2× design, additional degrees of freedom are needed to correct these two aberrations. The extra degrees of freedom come from the aspheric terms.

In addition to these optical designs being suitable for Generation 6 FPDs, they can be used at the Generation 7 and 8, which have 54 and 60-inch screens. The capability and virtually all the infrastructure to fabricate the four projection optics mirrors in the size needed for 60-inch screens already exists commercially.

The optical systems discussed above in Examples 1-7 have many advantages over the stitching approach and 1× approach for manufacturing FPDs. For example, it is possible to use the existing 32-inch mask infrastructure to create masks, as compared to creating an up to 60-ich mask infrastructure for 1× systems. Also, the optics on the mask side of the optical system can be about half the size needed for the 1× conventional design form.

No high-accuracy mask alignment system, as needed on the stitching based systems, are required. Fewer optical elements and less complicated prescriptions are needed to achieve an acceptable optical design residual and telecentricities as compared to optical systems operating at >2× magnifications; The all-reflective optical design form permits the system to simultaneously operate at G, H and I-line wavelengths or at any other wavelength or wavelength band that is compatible with metal or dielectric coating reflectivities. Sufficient back and front working distances to allow for stage structure, alignment hardware, etc. Also, acceptable optical performance over a slit width that is wide enough to permit a product throughput greater then FPD manufacturer's requirements.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An exposure system for manufacturing flat panel displays (FPDS) comprising:

a reticle stage adapted to hold a reticle;

a substrate stage adapted to hold a substrate;

a magnification reflective optical system that images the reticle onto the substrate, the reflective optical system comprising four powered mirrors; and a reflective corrector near one of the reticle and the substrate, wherein the reflective corrector is configured to correct residual aberrations and telecentricity errors in the system to produce an image with a desired undistorted shape without forming an intermediate image.

2. The exposure system of claim 1, wherein the reflective corrector comprises an aspheric mirror.

3. The exposure system of claim 1, wherein the reflective corrector comprises a first reflective corrector and a second reflective corrector, and wherein both the first and second reflective correctors comprise aspheric mirrors.

4. The exposure system of claim 1, wherein the reflective corrector comprises at least one powered mirror.

5. The exposure system of claim 4, wherein a power of the powered mirror is adjusted to compensate for curvature variation in wavefront incident on the powered mirror.

6. The exposure system of claim 1, wherein the reflective corrector comprises at least one mirror with a surface described by both spherical and aspheric terms.

7. The exposure system of claim 1, wherein the exposure system has a magnification of between 1.5× and 9×.

8. The exposure system of claim 1, wherein at least one of the four powered mirrors is convex.

9. The exposure system of claim 1, wherein at least one of the four powered mirrors is concave.

10. The exposure system of claim 1, wherein the four powered mirrors are a combination of convex and concave mirrors.

11. The exposure system of claim 1, wherein at least one of the four powered mirrors has an aspheric surface.

12. The exposure system of claim 1, wherein the exposure system is adapted for 42 inch FPD manufacture.

13. The exposure system of claim 1, wherein the exposure system is adapted for 54 inch FPD manufacture.

14. The exposure system of claim 1, wherein the exposure system is adapted for 60 inch FPD manufacture.

15. The exposure system of claim 1, wherein the four powered mirrors are not symmetric about their optical axes.

16. The exposure system of claim 1, wherein the exposure system has no obscuration.

17. The exposure system of claim 1, wherein curvatures of the four powered mirrors do not sum to zero.

18. The exposure system of claim 1, wherein each of the first and second reflective correctors is tilted at an angle of about 45° with respect to an optical axis.

19. The exposure system of claim 1, wherein the system is configured to receive a wavelength range that includes G-Line, H-Line, and I-Line wavelengths.

20. An exposure system for manufacturing flat panel displays (FPDs) comprising:
a reticle stage adapted to hold a reticle;
a substrate stage adapted to hold a substrate;
a magnification reflective optical system that images the reticle onto the substrate, the reflective optical system comprising at least two powered mirrors; and
a reflective corrector near one of the reticle and the substrate, wherein the reflective corrector is configured to correct residual aberrations and telecentricity errors in the system to produce an image with a desired undistorted shape without forming an intermediate image.

21. The exposure system of claim 20, wherein the reflective corrector comprises an aspheric mirror.

22. The exposure system of claim 20, wherein the reflective corrector comprises a first reflective corrector and a second reflective corrector, and wherein both the first and second reflective correctors comprise aspheric mirrors.

23. The exposure system of claim 20, wherein the reflective corrector comprises at least one powered mirror.

24. The exposure system of claim 23, wherein a power of the powered mirror is adjusted to compensate for curvature variation in wavefront incident on the powered mirror.

25. The exposure system of claim 20, wherein the reflective corrector comprises at least one mirror with a surface described by both spherical and aspheric terms.

26. The exposure system of claim 20, wherein at least one of the two powered mirrors has an aspheric surface.

27. The exposure system of claim 20, wherein the two powered mirrors are not symmetric about their optical axes.

28. The exposure system of claim 20, wherein the exposure system has no obscuration.

29. The exposure system of claim 20, wherein curvatures of the two powered mirrors do not sum to zero.

30. The exposure system of claim 20, wherein any of the two powered mirrors is convex.

31. The exposure system of claim 20, wherein any of the two powered mirrors is concave.

32. The exposure system of claim 20, wherein at least one of the two powered mirrors has an aspheric surface.

33. The exposure system of claim 20, wherein the two powered mirrors are not symmetric about their optical axes.

34. The exposure system of claim 20, wherein the exposure system has no obscuration.

35. The exposure system of claim 20, wherein the exposure system has a magnification of between 1.5× and 9×.

36. The exposure system of claim 20, wherein the two powered mirrors are a combination of convex and concave mirrors.

37. The exposure system of claim 20, wherein the exposure system is adapted for manufacturing of 42, 54, or 60 inch FPDs.

38. The exposure system of claim 20, wherein the reflective corrector is tilted at an angle of about 45° with respect to an optical axis.

39. The exposure system of claim 20, wherein the system is configured to receive a wavelength range that includes G-Line, H-Line, and I-Line wavelengths.

40. An exposure system for manufacturing flat panel displays (FPDs) comprising:
a reticle stage adapted to hold a reticle;
a substrate stage adapted to hold a substrate;
a magnification reflective optical system that images the reticle onto the substrate, the reflective optical system comprising a plurality of powered mirrors that are non-symmetric relative to their center axes; and
a reflective corrector near one of the reticle and the substrate, wherein the reflective corrector is configured to correct residual aberrations and telecentricity errors in the system to produce an image with a desired undistorted shape without forming an intermediate image.

41. The exposure system of claim 40, wherein the reflective corrector comprises an aspheric mirror.

42. The exposure system of claim 40, wherein the reflective corrector comprises a first reflective corrector and a second reflective corrector, and wherein both the first and second reflective correctors comprise two aspheric mirrors.

43. The exposure system of claim 40, wherein the reflective corrector comprises at least one powered mirror.

44. The exposure system of claim 43, wherein a power of the powered mirror is adjusted to compensate for curvature variation in wavefront incident on the powered mirror.

45. The exposure system of claim 40, wherein the reflective corrector comprises at least one mirror with a surface described by both spherical and aspheric terms.

46. The exposure system of claim 40, wherein the plurality of powered mirrors are a combination of convex and concave mirrors.

47. The exposure system of claim 40, wherein at least one of the plurality of powered mirrors has an aspheric surface.

48. The exposure system of claim 40, wherein the exposure system has no obscuration.

49. The exposure system of claim 40, wherein curvatures of the plurality of powered mirrors do not sum to zero.

50. The exposure system of claim 40, wherein the reflective corrector is tilted at an angle of about 45° with respect to an optical axis.

51. The exposure system of claim 40, wherein the system is configured to receive a wavelength range that includes G-Line, H-Line, and I-Line wavelengths.

* * * * *

UNITED STATES PATENT AND TRADEMARK OFFICE
CERTIFICATE OF CORRECTION

PATENT NO. : 7,405,802 B2  Page 1 of 1
APPLICATION NO. : 10/921097
DATED : July 29, 2008
INVENTOR(S) : Harned et al.

It is certified that error appears in the above-identified patent and that said Letters Patent is hereby corrected as shown below:

<u>Column 18</u>
Line 59 "comprise two aspheric" replace with --comprise aspheric--.

Signed and Sealed this

Twenty-third Day of December, 2008

JON W. DUDAS
*Director of the United States Patent and Trademark Office*